United States Patent
Ozaki et al.

(10) Patent No.: US 8,779,065 B2
(45) Date of Patent: Jul. 15, 2014

(54) FLUORINE-CONTAINING CURABLE RESIN, ACTIVE ENERGY BEAM-CURABLE COMPOSITION, AND CURED PRODUCT THEREOF

(75) Inventors: Yusuke Ozaki, Ichihara (JP); Hideya Suzuki, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/125,623

(22) PCT Filed: Jun. 11, 2012

(86) PCT No.: PCT/JP2012/064903
§ 371 (c)(1),
(2), (4) Date: Dec. 12, 2013

(87) PCT Pub. No.: WO2012/173088
PCT Pub. Date: Dec. 20, 2012

(65) Prior Publication Data
US 2014/0107278 A1 Apr. 17, 2014

(30) Foreign Application Priority Data
Jun. 17, 2011 (JP) ................. 2011-135145

(51) Int. Cl.
*C08F 114/18* (2006.01)
*C08F 259/08* (2006.01)
*C08F 8/30* (2006.01)
*C08F 2/46* (2006.01)
*C08L 27/12* (2006.01)
*C08F 114/16* (2006.01)

(52) U.S. Cl.
CPC ............. *C08F 114/16* (2013.01); *C08F 259/08* (2013.01); *C08F 8/30* (2013.01); *C08F 2/46* (2013.01); *C08L 27/12* (2013.01)
USPC ........ 525/326.2; 525/276; 525/374; 525/384; 525/385; 525/386; 524/544; 427/487

(58) Field of Classification Search
CPC ........ C08F 114/18; C08F 259/08; C08F 2/46; C08F 8/30
USPC .............. 525/326.2, 276, 374, 384, 385, 386; 524/544; 427/487
See application file for complete search history.

(56) References Cited

FOREIGN PATENT DOCUMENTS

| JP | 2009-132773 A | 6/2009 |
| JP | 2009132773 A * | 6/2009 |
| JP | 2009-256597 A | 11/2009 |
| JP | 2009256597 A * | 11/2009 |
| JP | 2011-093978 A | 5/2011 |
| JP | 2011-208046 A | 10/2011 |
| JP | 2011-213989 A | 10/2011 |
| WO | WO-2009/133770 A1 | 11/2009 |

OTHER PUBLICATIONS

International Search Report dated Sep. 4, 2012, issued for PCT/JP2012/064903.

* cited by examiner

*Primary Examiner* — Michael M Bernshteyn
(74) *Attorney, Agent, or Firm* — Edwards Wildman Palmer LLP

(57) ABSTRACT

The present invention provides a fluorine-containing curable resin that can impart high stain resistant properties to the surface of a cured coating film and can exhibit high stain resistant properties even when curing is performed in an air atmosphere (in the presence of oxygen). It is also an object to provide an active-energy-ray-curable composition that uses the fluorine-containing curable resin and can exhibit high stain resistant properties even when curing is performed in an air atmosphere and a cured product of the active-energy-ray-curable composition. To achieve the object, there is provided a fluorine-containing curable resin including a poly(perfluoroalkylene ether) chain, a maleimide group, and a mercapto group in a structure of a urethane polymer or a polymer composed of a monomer having a polymerizable unsaturated group.

10 Claims, 2 Drawing Sheets

(12) United States Patent
US 8,779,065 B2

FLUORINE-CONTAINING CURABLE RESIN, ACTIVE ENERGY BEAM-CURABLE COMPOSITION, AND CURED PRODUCT THEREOF

TECHNICAL FIELD

The present invention relates to a fluorine-containing curable resin that can impart high stain resistant properties to the surfaces of cured coating films even when curing is performed through irradiation with active energy rays in an air atmosphere (in the presence of oxygen) and that can be used as a fluorine-based surface modifier which can maintain the stain resistant properties of the surfaces of cured coating films even after stains attached to the surfaces of the cured coating films are wiped off. The present invention also relates to an active-energy-ray-curable composition that uses the fluorine-containing curable resin and a cured product of the composition.

BACKGROUND ART

Fluorine-based surface modifiers are excellent in terms of, for example, leveling properties, wettability, permeability, anti-blocking properties, slipping properties, water-oil repellency, and stain resistant properties and hence are widely used as additives that are added to various paints, coating materials, and the like.

For example, a cured coating film formed by applying and curing an active-energy-ray-curable composition containing such a fluorine-based surface modifier exhibits excellent surface properties. However, there are problems in that the production line is contaminated and the stain resistant properties of the surface of the cured coating film are degraded because part of the fluorine-based surface modifier is easily separated or evaporated from the surface of the cured coating film by heating, wetting, exposure to a chemical agent such as an acid or an alkali, cleaning for removing stains, or the like.

As an additive that can suppress the separation from the surface of the cured coating film and impart high stain resistant properties to the surface of the cured coating film, there has been proposed a fluorine-containing curable resin that has a poly(perfluoroalkylene ether) chain and has a polymerizable group that can be polymerized with other components in an active-energy-ray-curable composition (e.g., refer to PTL 1). However, there is a problem in that such a fluorine-containing curable resin cannot exhibit sufficient stain resistant properties when curing is performed through irradiation with active energy rays in an air atmosphere (in the presence of oxygen). Specifically, the polymerization of the fluorine-containing curable resin is inhibited by oxygen, and thus the polymerization of the fluorine-containing curable resin with other polymerizable components in the active-energy-ray-curable composition does not sufficiently proceed when the curing is performed through irradiation with active energy rays in an air atmosphere (in the presence of oxygen). This poses a problem in that a poly(perfluoroalkylene ether) chain cannot be sufficiently fixed onto the surface of the cured coating film and sufficient stain resistant properties cannot be exhibited.

As a fluorine-containing curable resin that can impart high stain resistant properties to the surface of a cured coating film even when curing is performed through irradiation with active energy rays in an air atmosphere, there has been proposed, for example, a fluorine-containing curable resin having a poly (perfluoroalkylene ether) chain and a maleimide group in its resin structure (e.g., refer to PTL 2). The fluorine-containing curable resin proposed in PTL 2 achieves the above effect through the cross-linking reaction of the maleimide group. However, there is still a problem in that the stain resistant properties of a cured coating film of the active-energy-ray-curable composition containing the fluorine-containing curable resin described in PTL 2 as a surface modifier is degraded once stains attached are wiped off.

Accordingly, a surface modifier that exhibits high stain resistant properties even when curing is performed in an air atmosphere (in the presence of oxygen) and can maintain stain resistant properties of the surface of a cured coating film even after stains attached to the surface of the cured coating film are wiped off has been demanded.

CITATION LIST

Patent Literature

PTL 1: International Publication No. WO2009/133770
PTL 2: Japanese Unexamined Patent Application Publication No. 2011-093978

SUMMARY OF INVENTION

Technical Problem

It is an object of the present invention to provide a fluorine-containing curable resin that can impart high stain resistant properties to the surfaces of cured coating films even when curing is performed through irradiation with active energy rays in an air atmosphere (in the presence of oxygen) and that can maintain the stain resistant properties of the surfaces of cured coating films even after stains attached to the surfaces of the cured coating films are wiped off. It is another object of the present invention to provide an active-energy-ray-curable composition that uses the fluorine-containing curable resin and can exhibit high stain resistant properties even when curing is performed in an air atmosphere and a cured product of the active-energy-ray-curable composition.

Solution to Problem

As a result of thorough studies conducted by the inventors of the present invention to achieve the above objects, they have found that a fluorine-containing curable resin containing a poly(perfluoroalkylene ether) chain, a maleimide group, and a mercapto group in a structure of a urethane polymer or a polymer composed of a monomer having a polymerizable unsaturated group or an active-energy-ray-curable composition containing the fluorine-containing curable resin as a fluorine-based surface modifier can suppress the evaporation or separation of the fluorine-containing curable resin or a decomposed product thereof from a cured coating film, can stably impart surface properties such as stain resistant properties to the surface of a coating film, can exhibit high stain resistant properties even when curing is performed in an air atmosphere, and can maintain the stain resistant properties on the surface of a cured coating film even after the stains attached to the surface of the cured coating film are wiped off. Thus, the present invention has been completed.

That is, the present invention provides a fluorine-containing curable resin including a poly(perfluoroalkylene ether) chain, a maleimide group, and a mercapto group in a structure of a polymer which is either a urethane polymer or a polymer composed of a monomer having a polymerizable unsaturated group.

The present invention also provides a cured product obtained by applying the fluorine-containing curable resin onto a base material and curing the applied fluorine-containing curable resin through irradiation with active energy rays, an active-energy-ray-curable composition containing the fluorine-containing curable resin, and a cured product obtained by applying the coating composition onto a base material and curing the applied composition through irradiation with active energy rays.

Advantageous Effects of Invention

When the fluorine-containing curable resin according to the present invention is mixed in an active-energy-ray-curable composition as a fluorine-based surface modifier, surface properties such as stain resistant properties can be imparted to the cured coating film of the coating composition. The fluorine-containing curable resin according to the present invention can impart surface properties such as remarkably high stain resistant properties to the surface of a coating film even when curing is performed through irradiation with ultraviolet rays in an air atmosphere (in the presence of oxygen). Furthermore, the fluorine-containing curable resin can maintain the stain resistant properties on the surface of a cured coating film even after stains attached to the surface of the cured coating film are wiped off.

Accordingly, the fluorine-containing curable resin of the present invention and the active-energy-ray-curable composition containing the fluorine-containing curable resin have an advantage in that sufficient performance can be exhibited not only in the case where curing is performed in a nitrogen atmosphere in which nitrogen purge is conducted to discharge air from a curing apparatus that applies active energy rays such as ultraviolet rays, but also in the case where nitrogen purge is difficult due to production cost, equipment conditions, and the like.

DESCRIPTION OF EMBODIMENTS

Figure 1:
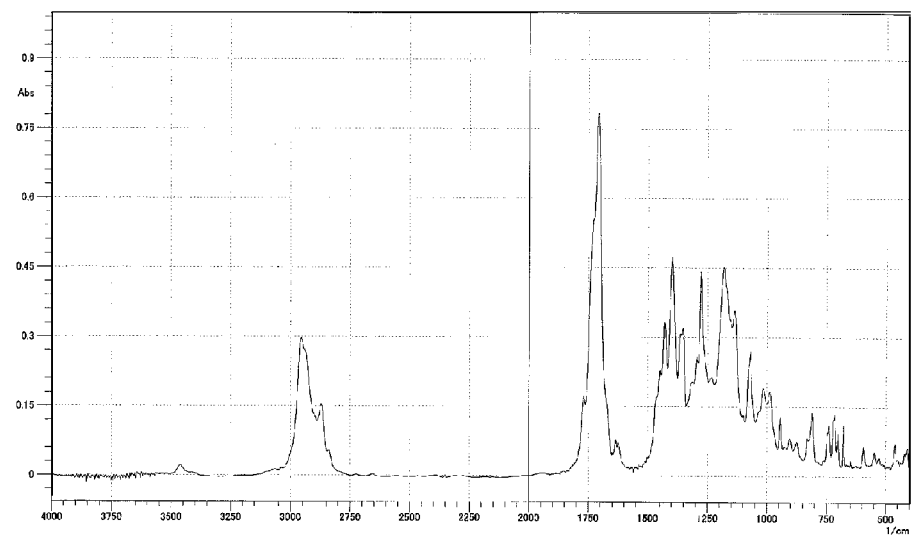
FIG. 1 is an IR spectrum chart of a fluorine-containing curable resin (1) obtained in Example 1.

A fluorine-containing curable resin of the present invention includes a poly(perfluoroalkylene ether) chain, a maleimide group, and a mercapto group in a polymer structure of a urethane polymer or a polymer composed of a monomer having a polymerizable unsaturated group. In particular, a fluorine-containing curable resin including a poly(perfluoroalkylene ether) chain, a maleimide group, and a mercapto group in a structure of a polymer composed of a monomer having a polymerizable unsaturated group.

First, the fluorine-containing curable resin including a poly(perfluoroalkylene ether) chain, a maleimide group, and a mercapto group in a polymer structure of a polymer composed of a monomer having a polymerizable unsaturated group will be described. The method for producing the fluorine-containing curable resin is not particularly limited as long as a fluorine-containing curable resin that has a structure of a polymer composed of a monomer having a polymerizable unsaturated group and includes a poly(perfluoroalkylene ether) chain, a maleimide group, and a mercapto group can be produced. An example of the method is a method in which a monomer (A) having a poly(perfluoroalkylene ether) chain and polymerizable unsaturated groups at both ends of the chain and a monomer (B) having a maleimide group and a polymerizable unsaturated group other than the maleimide group, the monomer (A) and the monomer (B) serving as essential monomer components, are copolymerized with each other in the presence of a polyfunctional thiol (C).

First, the monomer (A) having a poly(perfluoroalkylene ether) chain and polymerizable unsaturated groups at both ends of the chain and serving as a raw material of the fluorine-containing curable resin of the present invention will be described. The poly(perfluoroalkylene ether) chain included in the monomer (A) may have a structure in which a divalent fluorinated carbon group having 1 to 3 carbon atoms and an oxygen atom are alternately bonded. The divalent fluorinated carbon group having 1 to 3 carbon atoms may be a group of a single type or a combination of groups of two or more types. Specifically, such a structure is represented by structural formula (a1) below.

[Chem. 1]

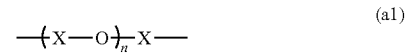

(a1)

[In the above structural formula (a), X represents structural formulae (a1-1) to (a1-5) below; in the structural formula (a1), all X's may have the same structure or a plurality of structures may be present on a random basis or in blocks; and n represents the number of repeating units and is an integer of 1 or more.]

[Chem. 2]

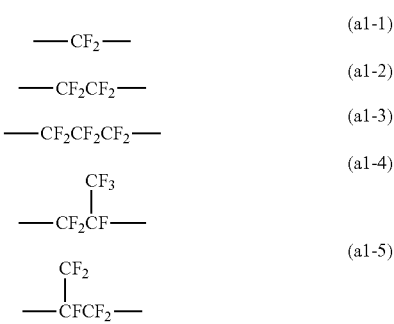

Among them, a combination of a perfluoromethylene structure represented by the structural formula (a1-1) and a perfluoroethylene structure represented by the structural formula (a1-2) is particularly preferred because good leveling properties of the active-energy-ray-curable composition containing the fluorine-containing curable resin of the present invention are achieved and a smooth coating film is formed. Herein, as for the existence ratio of the perfluoromethylene structure represented by the structural formula (a1-1) and the perfluoroethylene structure represented by the structural formula (a1-2), the molar ratio [structure (a1-1)/structure (a1-2)] is preferably 1/10 to 10/1 in terms of leveling properties. In addition, n in the structural formula (a1) is preferably in the range of 3 to 100 and more preferably in the range of 6 to 70.

The total number of fluorine atoms in a single poly(perfluoroalkylene ether) chain is preferably in the range of 18 to 200 and more preferably in the range of 25 to 150 because both the stain resistant properties of the active-energy-ray-curable composition of the present invention and the solubility of the fluorine-containing curable resin of the present invention in a non-fluorine-based material in the composition can be achieved.

The polymerizable monomer (A) can be produced by, for example, the following methods. First, methods in which a compound having hydroxyl groups at both ends of a poly(perfluoroalkylene ether) chain is used as a raw material are exemplified. Specific examples thereof are shown below.

Method 1: A method in which a dehydrochlorination reaction is caused between (meth)acrylic acid chloride and a compound having hydroxyl groups at both ends of a poly(perfluoroalkylene ether) chain Method 2: A method in which a dehydration reaction is caused between (meth)acrylic acid and a compound having hydroxyl groups at both ends of a poly(perfluoroalkylene ether) chain Method 3: A method in which a urethane-forming reaction is caused between 2-(meth)acryloyloxyethyl isocyanate and a compound having hydroxyl groups at both ends of a poly(perfluoroalkylene ether) chain Method 4: A method in which an esterification reaction is caused between itaconic anhydride and a compound having hydroxyl groups at both ends of a poly(perfluoroalkylene ether) chain Method 5: A method in which a dehydrochlorination reaction is caused between chloromethylstyrene and a compound having hydroxyl groups at both ends of a poly(perfluoroalkylene ether) chain Method 6: A method in which an esterification reaction is caused between (meth)acrylic anhydride and a compound having hydroxyl groups at both ends of a poly(perfluoroalkylene ether) chain Next, methods in which a compound having carboxyl groups at both ends of a poly(perfluoroalkylene ether) chain is used as a raw material are exemplified. Specific examples thereof are shown below.

Method 7: A method in which an esterification reaction is caused between 4-hydroxybutyl(meth)acrylate glycidyl ether and a compound having carboxyl groups at both ends of a poly(perfluoroalkylene ether) chain Method 8: A method in which an esterification reaction is caused between glycidyl(meth)acrylate and a compound having carboxyl groups at both ends of a poly(perfluoroalkylene ether) chain Furthermore, methods in which a compound having isocyanate groups at both ends of a poly(perfluoroalkylene ether) chain is used as a raw material are exemplified. Specific examples thereof are shown below.

Method 9: A method in which a reaction is caused between 2-hydroxyethyl(meth)acrylate and a compound having isocyanate groups at both ends of a poly(perfluoroalkylene ether) chain Method 10: A method in which a reaction is caused between 2-hydroxyethyl(meth)acrylamide and a compound having isocyanate groups at both ends of a poly(perfluoroalkylene ether) chain Moreover, a method in which a compound having epoxy groups at both ends of a poly(perfluoroalkylene ether) chain is used as a raw material is exemplified. A specific example thereof is shown below.

Method 11: A method in which an esterification reaction is caused between (meth)acrylic acid and a compound having epoxy groups at both ends of a poly(perfluoroalkylene ether) chain Among the methods described above, a method in which a dehydrochlorination reaction is caused between (meth)acrylic acid chloride and a compound having hydroxyl groups at both ends of a poly(perfluoroalkylene ether) chain, a method in which a urethane-forming reaction is caused between 2-(meth)acryloyloxyethyl isocyanate and a compound having hydroxyl groups at both ends of a poly(perfluoroalkylene ether) chain, a method in which an esterification reaction is caused between (meth)acrylic anhydride and a compound having hydroxyl groups at both ends of a poly(perfluoroalkylene ether) chain, and a method in which a dehydrochlorination reaction is caused between chloromethylstyrene and a compound having hydroxyl groups at both ends of a poly(perfluoroalkylene ether) chain are particularly preferred in terms of ease of synthesis.

Examples of the compound having a poly(perfluoroalkylene ether) chain and used in the production of the polymerizable monomer (A) include compounds having structures represented by general formulae (a2-1) to (a2-6) below. Note that "-PFPE-" in the following structural formulae represents the poly(perfluoroalkylene ether) chain.

[Chem. 3]

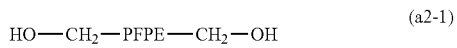
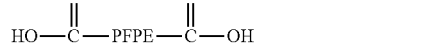
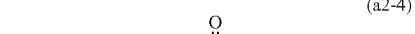
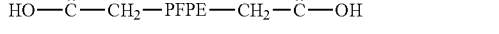

Examples of the polymerizable unsaturated group present at both ends of the poly(perfluoroalkylene ether) chain of the polymerizable monomer (A) include polymerizable unsaturated groups represented by structural formulae U-1 to U-5 below.

[Chem. 4]

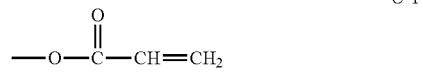

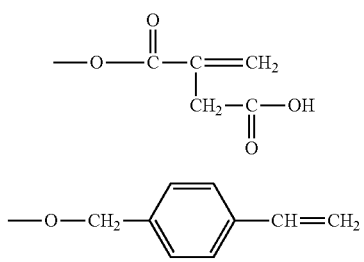

Among these polymerizable unsaturated groups, an acryloyloxy group represented by the structural formula U-1, a methacryloyloxy group represented by the structural formula U-2, and a styryl group represented by the structural formula U-5 are preferred in terms of the availability and ease of production of the polymerizable monomer (A) or ease of copolymerization with a polymerizable monomer (B) described below.

In the present invention, the "(meth)acryloyl group" represents at least one of a methacryloyl group and an acryloyl group, the "(meth)acrylate" represents at least one of a methacrylate and an acrylate, and the "(meth)acrylic acid" represents at least one of methacrylic acid and acrylic acid.

Specific examples of the polymerizable monomer (A) include monomers represented by structural formulae (A-1) to (A-13) below. Note that "-PFPE-" in the following structural formulae represents a poly(perfluoroalkylene ether) chain.

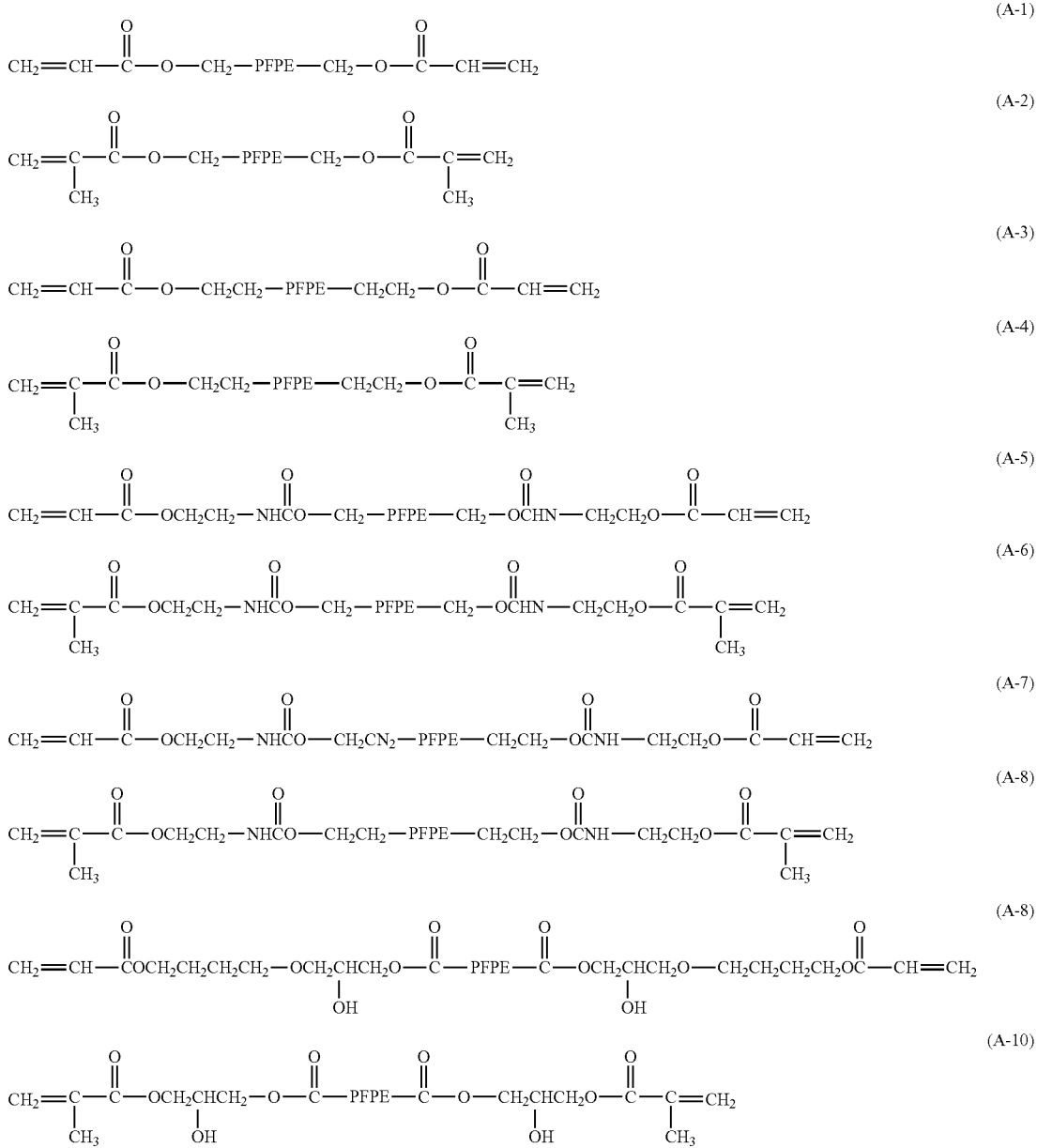

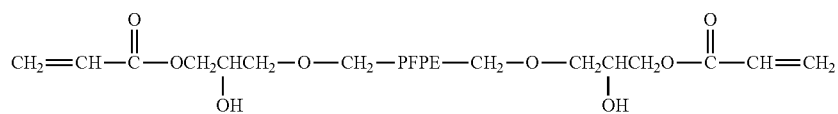
(A-11)

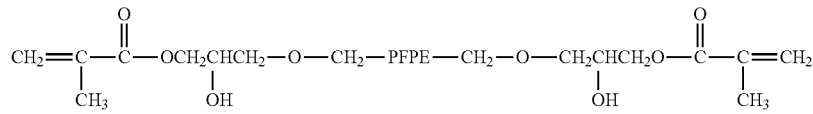
(A-12)

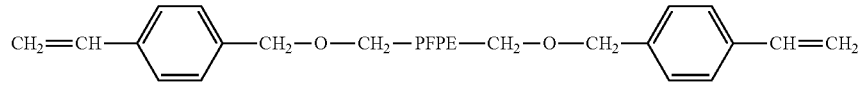
(A-13)

Among them, monomers represented by the structural formulae (A-1), (A-2), (A-5), (A-6), (A-11), (A-12), and (A-13), which have (meth)acryloyl groups at both ends of a poly(perfluoroalkylene ether) chain, are preferably used because the polymerizable monomer (A) is easily industrially produced. Monomers represented by the structural formulae (A-2) and (A-13), which have methacryloyl groups or styryl groups at both ends of a poly(perfluoroalkylene ether) chain, are more preferably used because the durability after curing can be further improved.

Next, the monomer (B) having a maleimide group and a polymerizable unsaturated group other than the maleimide group will be described. Examples of the polymerizable unsaturated group other than the maleimide group in the monomer (B) include a (meth)acryloyl group and a vinyl group. As in the case of the monomer (A), the polymerizable unsaturated group other than the maleimide group in the monomer (B) is preferably a (meth)acryloyl group because a (meth)acryloyl group has high polymerizability and the copolymerization readily proceeds.

The maleimide group in the monomer (B) is not particularly limited as long as the unsaturated carbon-carbon double bond of the maleimide group is not involved in the copolymerization reaction of the monomer (A) and the monomer (B), that is, the maleimide group does not have radical polymerizability in the copolymerization reaction. A disubstituted maleimide group represented by general formula (1) below in which substituents such as an alkyl group are bonded to carbon atoms of the unsaturated carbon-carbon double bond is preferably used. By using the monomer (B) having such a disubstituted maleimide group, the consumption of the double bond of the maleimide group can be suppressed in the copolymerization reaction with the monomer (A) and an intended fluorine-containing curable resin of the present invention can be produced. The maleimide group is a functional group that can be photo-cured by photodimerization caused as a result of irradiation with active energy rays regardless of the presence of a photopolymerization initiator (F) described below. Since the photodimerization is not inhibited by oxygen, the reaction sufficiently proceeds even when curing is performed in the air. Therefore, the polymer chains of the fluorine-containing curable resin of the present invention can be cross-linked with each other through the photodimerization using the maleimide group, and thus a strong cured film can be formed even when the curing is performed in the air.

[Chem. 6]

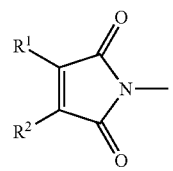
(1)

(In the formula, $R^1$ and $R^2$ each independently represent an alkyl group having 1 to 6 carbon atoms or $R^1$ and $R^2$ together form a five- or six-membered cyclic hydrocarbon group.)

Specific examples of the maleimide group represented by the general formula (1) include maleimide groups represented by formulae (1-1) to (1-3) below.

[Chem. 7]

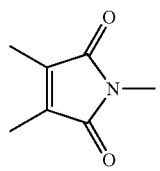
(1-1)

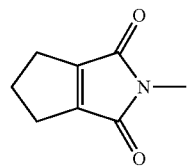
(1-2)

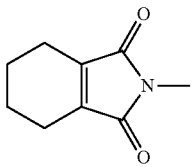
(1-3)

Specific examples of the monomer (B) include monomers represented by formulae (B-1) to (B-6) below.

[Chem. 8]

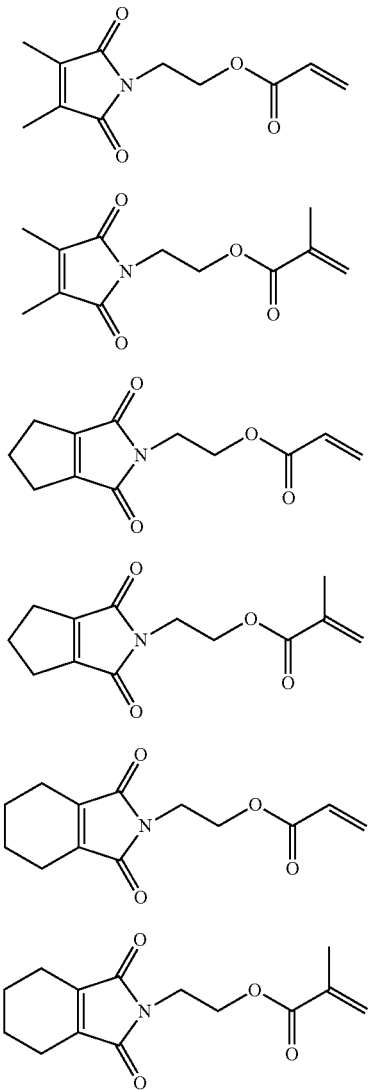

In the above-described method for producing a fluorine-containing curable resin according to the present invention, the compound (A) and the monomer (B) are essential monomer components, and other polymerizable unsaturated monomers that can be copolymerized with the compound (A) or the monomer (B) may be used. Examples of the other radically polymerizable unsaturated monomers include (meth)acrylates such as methyl(meth)acrylate, ethyl(meth)acrylate, n-propyl(meth)acrylate, n-butyl(meth)acrylate, isobutyl(meth)acrylate, n-pentyl(meth)acrylate, n-hexyl(meth)acrylate, n-heptyl(meth)acrylate, n-octyl(meth)acrylate, 2-ethylhexyl(meth)acrylate, nonyl(meth)acrylate, decyl(meth)acrylate, dodecyl(meth)acrylate, cyclohexyl(meth)acrylate, isobornyl(meth)acrylate, dicyclopentanyl(meth)acrylate, and dicyclopentenyl(meth)acrylate;

aromatic vinyl compounds such as styrene, α-methylstyrene, p-methylstyrene, and p-methoxystyrene; and maleimide compounds such as maleimide, N-methylmaleimide, N-ethylmaleimide, N-propylmaleimide, N-butylmaleimide, N-hexylmaleimide, N-octylmaleimide, N-dodecylmaleimide, N-stearylmaleimide, N-phenylmaleimide, and N-cyclohexylmaleimide.

Next, the polyfunctional thiol (C) will be described. The polyfunctional thiol (C) may be an ester compound (C-1) obtained by, for example, causing a reaction of a polyol (c-1) having three or more hydroxyl groups and a carboxylic acid (c-2) having a mercapto group.

Specific examples of the ester compound (C-1) include trimethylolpropane tristhioglycolate, pentaerythritol tetrakisthioglycolate, dipentaerythritol hexakisthioglycolate, trimethylolpropane tristhiopropionate, pentaerythritol tetrakisthiopropionate, dipentaerythritol hexakisthiopropionate, trimethylolpropane tris(3-mercaptobutyrate), pentaerythritol tetrakis(3-mercaptobutyrate), dipentaerythritol hexakis(3-mercaptobutyrate), tris(mercapto glycol oxyethyl)isocyanurate, tris(mercaptopropyloxyethyl)isocyanurate, and tris(3-mercaptobutyloxyethyl)isocyanurate. Among them, at least one compound selected from the group consisting of pentaerythritol tetrakis(3-mercaptobutyrate), pentaerythritol tetrakisthiopropionate, tris(3-mercaptobutyloxyethyl)isocyanurate, and dipentaerythritol hexakisthiopropionate is preferably used because high stain resistant properties are exhibited even when curing is performed in an air atmosphere.

The content of the polyfunctional thiol (C) is preferably in the range of 0.1 to 50 parts by mass, more preferably in the range of 0.5 to 30 parts by mass, and further preferably in the range of 1 to 15 parts by mass relative to 100 parts by mass in total of the monomers having a polymerizable unsaturated group.

In the case where only the monomer (A) and monomer (B) are used as the monomers having a polymerizable unsaturated group, the content of the polyfunctional thiol (C) is preferably in the range of 0.1 to 50 parts by mass, more preferably in the range of 0.5 to 30 parts by mass, and further preferably in the range of 1 to 15 parts by mass relative to 100 parts by mass in total of the monomer (A) and monomer (B).

In the case where the monomer (A), the monomer (B), and the other polymerizable unsaturated monomers are used as the monomers having a polymerizable unsaturated group, the content of the polyfunctional thiol (C) is preferably in the range of 0.1 to 50 parts by mass, more preferably in the range of 0.5 to 30 parts by mass, and further preferably in the range of 1 to 15 parts by mass relative to 100 parts by mass in total of the monomer (A), the monomer (B), and the other polymerizable unsaturated monomers.

The fluorine-containing curable resin of the present invention has a mercapto group. In the case where the polyfunctional thiol (C) is present when the monomer (A), the monomer (B), and optionally the other polymerizable unsaturated monomers are copolymerized, the polyfunctional thiol (C) serves as a chain transfer agent. In other words, a hydrogen radical is extracted from the mercapto group of the polyfunctional thiol (C) by a radical generated from a radical polymerization initiator or a radical at the end of a polymer chain formed by polymerization, to generate a thiyl radical. Since the polymerization of the monomer (A) and the like is initiated from the thiyl radical, a resin including the polyfunctional thiol (C) bonded to a polymer chain or the end of the polymer chain is obtained. The polyfunctional thiol (C) has a plurality of mercapto groups and thus mercapto groups that are not formed into thiyl radicals are also present. Such mercapto groups are left in the polymer chain or the end of the polymer chain. As a result, the fluorine-containing curable resin of the present invention having a mercapto group in its polymer chain or at the end of the polymer chain can be obtained. As described above, when a mercapto group is contained in the polymer chain or at the end of the polymer chain, the mercapto group serves as a site that can be cured with active energy rays. The curing is not easily inhibited even in an air atmosphere and thus favorably proceeds. Therefore, the fluorine-containing curable resin can be used as a fluorine-based surface modifier that can maintain the stain resistant properties of the surface of a cured coating film even after stains attached to the surface of the cured coating film are wiped off. Furthermore, the fluorine-containing curable resin of the present invention has a maleimide group. The maleimide group causes cross-linking at the surface of the fluorine-containing curable resin layer through dimerization and the mercapto group is cross-linked with other resins, and thus a strong cured product is obtained.

The monomer (A), the monomer (B), and optionally the other polymerizable unsaturated monomers are copolymerized by, for example, a method in which these monomer components are polymerized in an organic solvent in the presence of a radical polymerization initiator. The organic solvent used herein is preferably a ketone solvent, an ester solvent, an amide solvent, a sulfoxide solvent, an ether solvent, a hydrocarbon solvent, or a fluorocarbon solvent. Specific examples of the organic solvent include acetone, methyl ethyl ketone, methyl isobutyl ketone, cyclohexanone, ethyl acetate, butyl acetate, propylene glycol monomethyl ether acetate, dimethylformamide, dimethylacetamide, N-methylpyrrolidone, dimethylsulfoxide, diethyl ether, diisopropyl ether, tetrahydrofuran, dioxane, toluene, xylene, and 1,3-bis(trifluoromethyl)benzene. They can be appropriately selected in consideration of the boiling point, the solubility of monomers, and the polymerizability.

Examples of the radical polymerization initiator used in the copolymerization include peroxides such as benzoyl peroxide and azo compounds such as azobisisobutyronitrile. It is preferred to appropriately set the polymerization temperature in accordance with the type of radical polymerization initiator used. If necessary, a chain transfer agent such as lauryl mercaptan, 2-mercaptoethanol, thioglycerol, ethyl thioglycolate, and octyl thioglicolate can also be used.

Another fluorine-containing curable resin of the present invention includes a poly(perfluoroalkylene ether) chain, a maleimide group, and a mercapto group in a polymer structure of a urethane polymer. Such a fluorine-containing curable resin can be produced by, for example, the following method. A compound having the poly(perfluoroalkylene ether) chain and two hydroxyl groups is mixed with a compound having a maleimide group and two hydroxyl groups. The polyaddition reaction of a compound having two isocyanate groups is then caused under the condition that the amount of isocyanate groups is excessively larger than that of hydroxyl groups. Subsequently, a polyfunctional thiol compound is caused to react under the condition that the number of moles of the polyfunctional thiol compound is excessively larger than that of NCO left at the end.

To achieve high leveling properties and good compatibility with other components in the production of the active-energy-ray-curable composition of the present invention, the number-average molecular weight (Mn) of the fluorine-containing curable resin of the present invention is preferably in the range of 500 to 50,000 and more preferably in the range of 1,500 to 20,000; and the weight-average molecular weight (Mw) of the fluorine-containing curable resin of the present invention is preferably in the range of 2,000 to 100,000 and more preferably in the range of 3,000 to 50,000. Herein, the number-average molecular weight (Mn) and the weight-average molecular weight (Mw) are calculated in terms of polystyrene on the basis of measurements by gel permeation chromatography (hereafter, abbreviated as "GPC"). The GPC measurement conditions are as follows.

[GPC Measurement Conditions]
Measurement instrument: "HLC-8220 GPC" manufactured by Tosoh Corporation
Columns: guard column "HHR-H" (6.0 mm I.D.×4 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
Detector: ELSD ("ELSD 2000" manufactured by Alltech associates, Inc.)
Data processing: "GPC-8020 Model II data analysis version 4.30" manufactured by Tosoh Corporation
Measurement conditions: Column temperature 40° C.
Developing solvent tetrahydrofuran (THF)
Flow rate 1.0 ml/min
Sample: a solution (5 µl) prepared by filtering 1.0% by mass tetrahydrofuran solution in terms of resin solid content through a microfilter
Standard sample: The following monodisperse polystyrenes having a known molecular weight were used in conformity with the measurement manual of the "GPC-8020 Model II data analysis version 4.30".
(Monodisperse Polystyrenes)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
"F-288" manufactured by Tosoh Corporation
"F-550" manufactured by Tosoh Corporation The fluorine-containing curable resin according to the present invention itself can be used as a main agent of an active-energy-ray-curable composition. However, since this resin has an excellent surface modification capability, when the resin is used as a fluorine-based surface modifier added to an active-energy-ray-curable composition, excellent stain resistant properties can be imparted to the cured coating film.

The active-energy-ray-curable composition according to the present invention contains the fluorine-containing curable resin according to the present invention and, as a main component, an active-energy-ray-curable resin (D) or an active-energy-ray-curable monomer (E). Note that, in the active-energy-ray-curable composition according to the present invention, the active-energy-ray-curable resin (D) and the active-energy-ray-curable monomer (E) may be used alone or in combination. The fluorine-containing curable resin according to the present invention is preferably used as a fluorine-containing surface modifier in the active-energy-ray-curable composition.

Examples of the active-energy-ray-curable resin (D) include urethane(meth)acrylate resins, unsaturated polyester resins, epoxy(meth)acrylate resins, polyester(meth)acrylate resins, acrylic(meth)acrylate resins, and resins having a maleimide group. In the present invention, in particular, urethane (meth)acrylate resins are preferred in terms of, for example, transparency and low shrinkage.

Such a urethane(meth)acrylate resin used herein may be a resin that has a urethane bond and a (meth)acryloyl group and is obtained by causing a reaction between an aliphatic polyisocyanate compound or an aromatic polyisocyanate compound and a (meth)acrylate compound having a hydroxyl group.

Examples of the aliphatic polyisocyanate compound include tetramethylene diisocyanate, pentamethylene diisocyanate, hexamethylene diisocyanate, heptamethylene diisocyanate, octamethylene diisocyanate, decamethylene diisocyanate, 2-methyl-1,5-pentane diisocyanate, 3-methyl-1,5-pentane diisocyanate, dodecamethylene diisocyanate, 2-methylpentamethylene diisocyanate, 2,2,4-trimethylhexamethylene diisocyanate, 2,4,4-trimethylhexamethylene diisocyanate, isophorone diisocyanate, norbornane diisocyanate, hydrogenated diphenylmethane diisocyanate, hydrogenated tolylene diisocyanate, hydrogenated xylylene diisocyanate, hydrogenated tetramethylxylylene diisocyanate, and cyclohexyl diisocyanate. Examples of the aromatic polyisocyanate compound include tolylene diisocyanate, 4,4'-diphenylmethane diisocyanate, xylylene diisocyanate, 1,5-naphthalene diisocyanate, tolidine diisocyanate, and p-phenylene diisocyanate.

Examples of the acrylate compound having a hydroxyl group include 2-hydroxyethyl(meth)acrylate, 2-hydroxypropyl(meth)acrylate, 2-hydroxybutyl(meth)acrylate, 4-hydroxybutyl(meth)acrylate, dihydric alcohol mono(meth)acrylates such as 1,5-pentanediol mono(meth)acrylate, 1,6-hexanediol mono(meth)acrylate, neopentyl glycol mono(meth)acrylate, and hydroxypivalate neopentyl glycol mono(meth)acrylate; trihydric alcohol mono/di(meth)acrylates such as trimethylolpropane di(meth)acrylate, ethoxylated trimethylolpropane(meth)acrylate, propoxylated trimethylolpropane di(meth)acrylate, glycerin di(meth)acrylate, and bis(2-(meth)acryloyloxyethyl)hydroxyethylisocyanurate, and mono/di(meth)acrylates having a hydroxyl group provided by modifying some of alcoholic hydroxyl groups of the foregoing with ε-caprolactone; compounds having a single hydroxyl group and three or more (meth)acryloyl groups such as pentaerythritol tri(meth)acrylate, ditrimethylolpropane tri(meth)acrylate, and dipentaerythritol penta(meth)acrylate, and polyfunctional (meth)acrylates having a hydroxyl group provided by modifying the compounds with ε-caprolactone; (meth)acrylate compounds having an oxyalkylene chain such as dipropylene glycol mono(meth)acrylate, diethylene glycol mono(meth)acrylate, polypropylene glycol mono(meth)acrylate, and polyethylene glycol mono(meth)acrylate; (meth)acrylate compounds having block oxyalkylene chains such as polyethylene glycol-polypropylene glycol mono(meth)acrylate and polyoxybutylene-polyoxypropylene mono(meth)acrylate; and (meth)acrylate compounds having random oxyalkylene chains such as poly(ethylene glycol-tetramethylene glycol)mono(meth)acrylate and poly(propylene glycol-tetramethylene glycol)mono(meth)acrylate.

The reaction between an aliphatic polyisocyanate compound or an aromatic polyisocyanate compound and an acrylate compound having a hydroxyl group can be conducted in a standard manner in the presence of a urethane-forming catalyst. Specific examples of a urethane-forming catalyst usable herein include amines such as pyridine, pyrrole, triethylamine, diethylamine, and dibutylamine; phosphines such as triphenylphosphine and triethylphosphine; organic tin compounds such as dibutyl tin dilaurate, octyl tin trilaurate, octyl tin diacetate, dibutyl tin diacetate, and tin octylate; and organic metal compounds such as zinc octylate.

Among the urethane acrylate resins, resins obtained through a reaction between an aliphatic polyisocyanate compound and a (meth)acrylate compound having a hydroxyl group are particularly preferred because the cured coating films have high transparency and the resins have high sensitivity to active energy rays and high curability.

The unsaturated polyester resin is a curable resin obtained through polycondensation between an α,β-unsaturated dibasic acid, an acid anhydride thereof, an aromatic saturated dibasic acid, or an acid anhydride thereof and a glycol. Examples of the α,β-unsaturated dibasic acid or the acid anhydride thereof include maleic acid, maleic anhydride, fumaric acid, itaconic acid, citraconic acid, chloromaleic acid, and esters of the foregoing. Examples of the aromatic saturated dibasic acid or the acid anhydride thereof include phthalic acid, phthalic anhydride, isophthalic acid, terephthalic acid, nitrophthalic acid, tetrahydrophthalic anhydride, endomethylene tetrahydrophthalic anhydride, halogenated phthalic anhydrides, and esters of the foregoing. Examples of an aliphatic or alicyclic saturated dibasic acid include oxalic acid, malonic acid, succinic acid, adipic acid, sebacic acid, azelaic acid, glutaric acid, hexahydrophthalic anhydride, and esters of the foregoing. Examples of the glycol include ethylene glycol, propylene glycol, diethylene glycol, dipropylene glycol, 1,3-butanediol, 1,4-butanediol, 2-methylpropane-1,3-diol, neopentyl glycol, triethylene glycol, tetraethylene glycol, 1,5-pentanediol, 1,6-hexanediol, bisphenol A, hydrogenated bisphenol A, ethylene glycol carbonate, and 2,2-di-(4-hydroxypropoxydiphenyl)propane; and an oxide such as ethylene oxide or propylene oxide may be similarly used.

Examples of an epoxy vinyl ester resin include resins obtained through a reaction between (meth)acrylic acid and an epoxy group of an epoxy resin such as a bisphenol A epoxy resin, a bisphenol F epoxy resin, a phenol-novolac epoxy resin, or a cresol-novolac epoxy resin.

Examples of the resins having a maleimide group include a bifunctional maleimide urethane compound obtained by urethane formation between N-hydroxyethylmaleimide and isophorone diisocyanate; a bifunctional maleimide ester compound obtained by esterification between maleimide acetic acid and polytetramethylene glycol; a tetrafunctional maleimide ester compound obtained by esterification between maleimide caproic acid and a tetraethylene oxide adduct of pentaerythritol; and a polyfunctional maleimide ester compound obtained by esterification between maleimide acetic acid and a polyhydric alcohol compound. Such active-energy-ray-curable resins (D) may be used alone or in combination of two or more.

Examples of the active-energy-ray-curable monomer (E) include ethylene glycol di(meth)acrylate, diethylene glycol di(meth)acrylate, triethylene glycol di(meth)acrylate, polyethylene glycol di(meth)acrylate having a number-average molecular weight in the range of 150 to 1000, propylene glycol di(meth)acrylate, dipropylene glycol di(meth)acrylate, tripropylene glycol di(meth)acrylate, polypropylene glycol di(meth)acrylate having a number-average molecular weight in the range of 150 to 1000, neopentyl glycol di(meth)acrylate, 1,3-butanediol di(meth)acrylate, 1,4-butanediol di(meth)acrylate, 1,6-hexanediol di(meth)acrylate, hydroxypivalic acid ester neopentyl glycol di(meth)acrylate, bisphenol A di(meth)acrylate, trimethylolpropane tri(meth)acrylate, pentaerythritol tri(meth)acrylate, dipentaerythritol hexa(meth)acrylate, pentaerythritol tetra(meth)acrylate, trimethylolpropane di(meth)acrylate, dipentaerythritol penta (meth)acrylate, dicyclopentenyl(meth)acrylate; aliphatic alkyl(meth)acrylates such as methyl(meth)acrylate, propyl (meth)acrylate, butyl(meth)acrylate, t-butyl(meth)acrylate, 2-ethylhexyl(meth)acrylate, octyl(meth)acrylate, decyl (meth)acrylate, isodecyl(meth)acrylate, lauryl(meth)acrylate, stearyl(meth)acrylate, and isostearyl(meth)acrylate; glycerol(meth)acrylate, 2-hydroxyethyl(meth)acrylate, 3-chloro-2-hydroxypropyl(meth)acrylate, glycidyl(meth) acrylate, allyl(meth)acrylate, 2-butoxyethyl(meth)acrylate, 2-(diethylamino)ethyl(meth)acrylate, 2-(dimethylamino) ethyl(meth)acrylate, γ-(meth)acryloxypropyltrimethoxysilane, 2-methoxyethyl(meth)acrylate, methoxydiethylene glycol(meth)acrylate, methoxydipropylene glycol(meth) acrylate, nonylphenoxypolyethylene glycol(meth)acrylate, nonylphenoxypolypropylene glycol(meth)acrylate, phenoxyethyl(meth)acrylate, phenoxydipropylene glycol(meth) acrylate, phenoxypolypropylene glycol(meth)acrylate, polybutadiene(meth)acrylate, polyethylene glycol-polypropylene glycol(meth)acrylate, polyethylene glycol-polybutylene glycol(meth)acrylate, polystyrylethyl(meth)acrylate, benzyl(meth)acrylate, cyclohexyl(meth)acrylate, dicyclopentanyl(meth)acrylate, dicyclopentenyl(meth)acrylate, isobornyl(meth)acrylate, methoxylated cyclodecatriene (meth)acrylate, phenyl(meth)acrylate; and maleimides such as maleimide, N-methylmaleimide, N-ethylmaleimide, N-propylmaleimide, N-butylmaleimide, N-hexylmaleimide, N-octylmaleimide, N-dodecylmaleimide, N-stearylmaleimide, N-phenylmaleimide, N-cyclohexylmaleimide, 2-maleimideethyl-ethylcarbonate, 2-maleimideethyl-propylcarbonate, N-ethyl-(2-maleimideethyl)carbamate, N,N-hexamethylenebismaleimide, polypropylene glycol-bis(3-maleimidepropyl)ether, bis(2-maleimideethyl)carbonate, and 1,4-dimaleimide cyclohexane.

Among them, polyfunctional (meth)acrylates having a functionality of three or more, such as trimethylolpropane tri(meth)acrylate, pentaerythritol tri(meth)acrylate, dipentaerythritol hexa(meth)acrylate, and pentaerythritol tetra (meth)acrylate are particularly preferred because cured coating films having high hardness are provided. Such active-energy-ray-curable monomers (E) may be used alone or in combination of two or more.

When the fluorine-containing curable resin according to the present invention is used as a fluorine-containing surface modifier in the active-energy-ray-curable composition according to the present invention, the content of the resin is preferably in the range of 0.01 to 10 parts by mass and more preferably in the range of 0.1 to 5 parts by mass relative to 100 parts by mass in total of the active-energy-ray-curable resin (D) and the active-energy-ray-curable monomer (E). When the content of the fluorine-containing curable resin according to the present invention is in such a range, sufficiently high leveling properties, water-oil repellency, and stain resistant properties can be achieved and the cured composition has sufficiently high hardness and transparency.

By applying the fluorine-containing curable resin or active-energy-ray-curable composition according to the present invention to a base material and then irradiating the applied resin or composition with active energy rays, a cured coating film can be formed. The active energy rays denote an ionizing radiation such as ultraviolet rays, electron beams, α-rays, β-rays, or γ-rays. When such a cured coating film is formed through irradiation with ultraviolet rays serving as active energy rays, a photopolymerization initiator (F) is preferably added to the fluorine-containing curable resin or the active-energy-ray-curable composition to improve the curability. If necessary, a photosensitizer may be further added to improve the curability. On the other hand, when an ionizing radiation such as electron beams, α-rays, β-rays, or γ-rays is used, rapid curing is achieved without use of a photopolymerization initiator or a photosensitizer and hence it is not necessary to add the photopolymerization initiator (F) or a photosensitizer.

The photopolymerization initiator (F) may be an intramolecular-cleavage photopolymerization initiator or a hydrogen-abstraction photopolymerization initiator. Examples of the intramolecular-cleavage photopolymerization initiator include acetophenone-based compounds such as diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl(2-hydroxy-2-propyl)ketone, 1-hydroxycyclohexyl phenyl ketone, 2-methyl-2-morpholino(4-thiomethylphenyl)propan-1-one, and 2-benzyl-2-dimethylamino-1-(4-morpholinophenyl)butanone; benzoins such as benzoin, benzoin methyl ether, and benzoin isopropyl ether; acylphosphine oxide-based compounds such as 2,4,6-trimethylbenzoin diphenylphosphine oxide and bis(2,4,6-trimethylbenzoyl)phenylphosphine oxide; and benzil and methylphenylglyoxy ester.

Examples of the hydrogen-abstraction photopolymerization initiator include benzophenone-based compounds such as benzophenone, o-benzoyl methylbenzoate-4-phenylbenzophenone, 4,4'-dichlorobenzophenone, hydroxybenzophenone, 4-benzoyl-4'-methyl-diphenylsulfide, acrylated benzophenone, 3,3',4,4'-tetra(t-butylperoxycarbonyl) benzophenone, and 3,3'-dimethyl-4-methoxybenzophenone; thioxanthone-based compounds such as 2-isopropylthioxanthone, 2,4-dimethylthioxanthone, 2,4-diethylthioxanthone, and 2,4-dichlorothioxanthone; aminobenzophenone-based compounds such as Michler's ketone and 4,4'-diethylaminobenzophenone; 10-butyl-2-chloroacridone, 2-ethylanthraquinone, 9,10-phenanthrenequinone, and camphorquinone.

Among the above-described photopolymerization initiators (F), in view of high compatibility with the active-energy-ray-curable resin (D) and the active-energy-ray-curable monomer (E) in the active-energy-ray-curable composition, 1-hydroxycyclohexyl phenyl ketone and benzophenone are preferred, in particular, 1-hydroxycyclohexyl phenyl ketone is preferred. Such photopolymerization initiators (F) may be used alone or in combination of two or more.

Examples of the photosensitizer include amines such as aliphatic amines and aromatic amines; ureas such as o-tolylthiourea; and sulfur compounds such as sodium diethyldithiophosphate and s-benzylisothiuronium-p-toluenesulfonate.

The contents of the photopolymerization initiator and the photosensitizer are each preferably 0.01 to 20 parts by mass, more preferably 0.1 to 15 parts by mass, and further preferably 0.3 to 7 parts by mass relative to 100 parts by mass of the nonvolatile components in the active-energy-ray-curable composition.

The active-energy-ray-curable composition according to the present invention may be used in combination with various mixing materials in accordance with, for example, an intended application or intended properties, for the purpose of adjusting the viscosity or the refractive index, adjusting the color of the coating film, or adjusting other properties such as properties of the coating material or physical properties of the coating film unless advantages of the present invention are degraded. Examples of the mixing materials include various organic solvents; various resins such as acrylic resins, phenolic resins, polyester resins, polystyrene resins, urethane resins, urea resins, melamine resins, alkyd resins, epoxy resins, polyamide resins, polycarbonate resins, petroleum resins, and fluorocarbon resins; various organic/inorganic particles such as fine particles of PTFE (polytetrafluoroethylene), polyethylene, polypropylene, carbon, titanium oxide, alumina, copper, and silica; polymerization initiators, polymerization inhibitors, antistatic agents, antifoaming agents, viscosity modifiers, light stabilizers, weathering stabilizers, thermal stabilizers, antioxidants, anticorrosives, slip additives, waxes, luster adjusters, release agents, compatibilizers, conductivity adjusting agents, pigments, dyes, dispersing agents, dispersion stabilizers, silicone surfactants, and hydrocarbon surfactants.

In the above-described mixing components, the organic solvents are advantageous for appropriately adjusting the viscosity of the solution of the active-energy-ray-curable composition according to the present invention and use of such an organic solvent facilitates control of the film thickness in thin-film coating. Examples of the organic solvents usable herein include aromatic hydrocarbons such as toluene and xylene; alcohols such as methanol, ethanol, isopropanol, and t-butanol; esters such as ethyl acetate and propylene glycol monomethyl ether acetate; and ketones such as methyl ethyl ketone, methyl isobutyl ketone, and cyclohexanone. These solvents may be used alone or in combination of two or more.

Although the amount of an organic solvent used varies depending on the application, the intended film thickness, and the intended viscosity, it is preferably 0.5 to 4 times the total mass of curable components on the mass basis.

As described above, active energy rays for curing the active-energy-ray-curable composition according to the present invention are an ionizing radiation such as ultraviolet rays, electron beams, $\alpha$-rays, $\beta$-rays, or $\gamma$-rays. As for specific examples of an energy source or a curing device, ultraviolet rays from a light source such as a germicidal lamp, an ultraviolet fluorescent lamp, carbon arc, a xenon lamp, a high-pressure mercury lamp for copying, a middle- or high-pressure mercury lamp, an ultrahigh-pressure mercury lamp, an electrodeless lamp, a metal halide lamp, or natural light; or electron beams from a scanning-type or curtain-type electron beam accelerator may be used.

Among them, ultraviolet rays are particularly preferably used. To avoid curing inhibition due to oxygen or the like, irradiation with ultraviolet rays is preferably performed in the atmosphere of an inert gas such as nitrogen gas. If necessary, thermal energy may be used as an additional energy source, that is, after curing with ultraviolet rays is performed, a heat treatment may be performed.

A coating process for the active-energy-ray-curable composition according to the present invention varies in accordance with the application. Examples of the coating process include application processes employing a gravure coater, a roll coater, a comma coater, a knife coater, an air knife coater, a curtain coater, a kiss coater, a shower coater, a wheeler coater, a spin coater, dipping, screen printing, spraying, an applicator, and a bar coater; and molding processes employing various molds.

A cured coating film formed of the fluorine-containing curable resin or active-energy-ray-curable composition according to the present invention has, for example, high stain resistant properties (e.g., ink repellency and fingerprint resistance) and high scratch resistance. Accordingly, by applying and curing the resin or composition on the surface of an article, for example, stain resistant properties and scratch resistance can be imparted to the surface of the article. In addition, the stain resistant properties of the surface of the cured coating film formed of the fluorine-containing curable resin or active-energy-ray-curable composition according to the present invention can be maintained even after stains attached to the surface of the cured coating film are wiped off. Furthermore, by adding the fluorine-containing curable resin according to the present invention as a fluorine-containing surface modifier to a coating material, leveling properties can also be imparted to the coating material. Accordingly, the active-energy-ray-curable composition according to the present invention has high leveling properties.

Examples of an article to which stain resistant properties (e.g., ink repellency and fingerprint resistance) can be imparted using the fluorine-containing curable resin or active-energy-ray-curable composition according to the present invention include films for polarizing plates of liquid crystal displays (LCDs), such as TAC films; screens of various displays such as plasma displays (PDPs) and organic EL displays; touch panels; cases or screens of electronic terminals such as cellular phones; transparent protective films for color filters (hereafter, referred to as "CFs") for liquid crystal displays; organic insulating films for liquid crystal TFT arrays; inkjet inks for forming electronic circuits; optical recording media such as CDs, DVDs, and Blu-ray Discs; transfer films for insert molding (IMD, IMF); rubber rollers for OA equipment such as copying machines and printers; glass plates of scanning parts of OA equipment such as copying machines and scanners; optical lenses for cameras, video cameras, and glasses; windshields and glass plates of clocks and watches such as wristwatches; windows for various vehicles such as automobiles and railway vehicles; cover glasses and films for solar cells; various building materials such as decorative laminated sheets; windowpanes of houses; woodwork materials such as furniture; artificial/synthetic leather; various plastic molded articles such as cases of household electrical appliances; and FRP bathtubs. By applying the active-energy-ray-curable composition according to the present invention to the surface of such an article and irradiating the applied composition with active energy rays such as ultraviolet rays to form a cured coating film, stain resistant properties can be imparted to the surface of the article. By adding a fluorine-containing styrene compound according to the present invention to various coating materials suitable for the articles and applying and drying the coating materials, stain resistant properties can also be imparted to the surfaces of the articles.

Examples of a coating material to which the fluorine-containing curable resin according to the present invention is added so that the leveling properties are improved and the coating film has stain resistant properties (e.g., ink repellency and fingerprint resistance) and chemical resistance include hard coating materials, anti-glare (AG) coating materials, or low reflectance (LR) coating materials for films for polarizing plates of LCDs, such as TAC films; hard coating materials for screens of various displays such as plasma displays (PDPs) and organic EL displays; hard coating materials for touch panels; color resists, printing inks, inkjet inks, or coating materials for forming R, G, and B pixels for CFs; black resists, printing inks, inkjet inks, or coating materials for black matrix for CFs; resin compositions for pixel partitions for plasma displays (PDPs) and organic EL displays; coating materials or hard coating materials for cases of electronic terminals such as cellular phones; hard coating materials for screens of cellular phones; coating materials for transparent protective films for protecting the surfaces of CFs; coating materials for organic insulating films for liquid crystal TFT arrays; inkjet inks for forming electronic circuits; hard coating materials for optical recording media such as CDs, DVDs, and Blu-ray Discs; hard coating materials for transfer films for insert molding (IMD, IMF); coating materials for rubber rollers for OA equipment such as copying machines and printers; coating materials for glasses of scanning parts of OA equipment such as copying machines and scanners; coating materials for optical lenses for cameras, video cameras, and glasses; coating materials for windshields and glasses of clocks and watches such as wristwatches; coating materials for windows for various vehicles such as automobiles and railway vehicles; coating materials for antireflection films for cover glasses or films for solar cells; printing inks or coating materials for various building materials such as decorative laminated sheets; coating materials for windowpanes of houses; coating materials for woodwork materials such as furniture; coating materials for artificial/synthetic leather; paints or coating materials for various plastic molded articles such as cases of household electrical appliances; and paints or coating materials for FRP bathtubs.

Other articles to which scratch resistance and stain resistant properties can be imparted using the fluorine-containing curable resin or active-energy-ray-curable composition according to the present invention are prism sheets and scattering sheets, which are backlight members of LCDs. By adding the fluorine-containing curable resin according to the present invention to coating materials for prism sheets or scattering sheets, the leveling properties of the coating materials can be improved, and scratch resistance and stain resistant properties can be imparted to coating films formed of the coating materials.

Since a cured coating film formed of the fluorine-containing curable resin according to the present invention has a low refractive index, the resin may also be used as a coating material for low-refractive-index layers in antireflection layers that suppress reflections of fluorescent lamps or the like in the screens of various displays such as LCDs. In addition, by adding the fluorine-containing curable resin according to the present invention to coating materials for antireflection layers, in particular, coating materials for low-refractive-index layers in antireflection layers, the low refractive index of the coating films can be maintained and stain resistant properties can be imparted to the surfaces of the coating films.

Examples of other applications in which the fluorine-containing curable resin or active-energy-ray-curable composition according to the present invention can be used include optical-fiber cladding materials, waveguides, sealing materials for liquid crystal panels, various optical sealing materials, and optical adhesives.

In particular, in the application of a coating material for protective films for polarizing plates for LCDs, when the active-energy-ray-curable composition according to the present invention is used as an anti-glare coating material, among the above-described components, inorganic/organic fine particles such as silica fine particles, acrylic resin fine particles, or polystyrene resin fine particles are preferably mixed in an amount 0.1 to 0.5 times the total mass of the curable components in the active-energy-ray-curable composition according to the present invention because high anti-glare properties are achieved.

When the fluorine-containing curable resin or active-energy-ray-curable composition according to the present invention is used as an anti-glare coating material for protective films for polarizing plates for LCDs, an imprinting process may be employed in which the coating material to be cured is brought into contact with a mold having surface irregularities and then cured by irradiation with active energy rays from a side opposite to the mold so that the surface of the coating layer is embossed to impart anti-glare properties.

EXAMPLES

Hereinafter, the present invention will be further described in detail based on specific Examples. The measurements of IR spectrum, $^{13}$C-NMR, and GPC were performed under the following conditions.

[Measurement Conditions of IR Spectrum]
Instrument: Fourier transform infrared spectrometer ("NICOLET 380" manufactured by THERMO ELECTRON Co., Ltd.)
Method: KBr method

[Measurement Conditions of $^{13}$C-NMR]
Instrument: "AL-400" manufactured by JEOL Ltd.
Solvent: chloroform-d

[Measurement Conditions of GPC]
Measurement instrument: "HLC-8220 GPC" manufactured by Tosoh Corporation
Columns: guard column "HHR-H" (6.0 mm I.D.×4 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
+"TSK-GEL GMHHR-N" (7.8 mm I.D.×30 cm) manufactured by Tosoh Corporation
Detector: ELSD ("ELSD 2000" manufactured by Alltech associates, Inc.)
Data processing: "GPC-8020 Model II data analysis version 4.30" manufactured by Tosoh Corporation
Measurement conditions: Column temperature 40° C.
Developing solvent tetrahydrofuran (THF)
Flow rate 1.0 ml/min
Sample: a solution (5 µl) prepared by filtering 1.0% by mass tetrahydrofuran solution in terms of resin solid content through a microfilter
Standard sample: The following monodisperse polystyrenes having a known molecular weight were used in conformity with the measurement manual of the "GPC-8020 Model II data analysis version 4.30".
(Monodisperse Polystyrenes)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
"F-288" manufactured by Tosoh Corporation
"F-550" manufactured by Tosoh Corporation Synthetic Example 1

Synthesis of a Monomer (A) Having a poly(Perfluoroalkylene Ether) Chain and Polymerizable Unsaturated Groups at Both Ends of the Chain A glass flask equipped with a stirrer, a thermometer, a condenser tube, and a dropping device was charged with 20 parts by mass of a compound having a poly(perfluoroalkylene ether) chain and hydroxyl groups at both ends of the chain, the compound being represented by formula (a2-1-1) below, 10 parts by mass of 1,3-bis(trifluoromethyl)benzene serving as a solvent, 0.02 parts by mass of p-methoxyphenol serving as a polymerization inhibitor, and 1.5 parts by mass of triethylamine serving as a neutralizer. Stirring was initiated under air flow and, while the internal temperature of the flask was maintained at 10° C., 1.3 parts by mass of methacrylic acid chloride was dropped over one hour. After the dropping was completed, the mixed solution was stirred at 10° C. for one hour, heated to 30° C. and stirred for one hour, and then heated to 50° C. and stirred for 10 hours. The reaction was terminated after the disappearance of the methacrylic acid chloride was confirmed by the measurement of gas chromatography. The reaction product was then mixed with 70 parts by mass of 1,3-bis(trifluoromethyl)benzene serving as a solvent. Subsequently, a washing process was repeatedly performed three times in which the resulting solution was mixed with 80 parts by mass of ion-exchanged water, stirred, and left to stand to separate an aqueous layer, and the aqueous layer was removed. To the resulting solution, 0.02 parts by mass of p-methoxyphenol serving as a polymerization inhibitor was then added, and 8 parts by mass of magnesium sulfate serving as a dehydrating agent was added. The solution was left to stand for one day to be completely dehydrated. The dehydrating agent was then removed by filtration.

[Chem. 9]

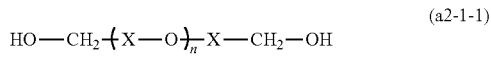

(a2-1-1)

(In the formula, X represents a perfluoromethylene group and a perfluoroethylene group; the average number of perfluoromethylene groups is 17 per molecule and the average number of perfluoroethylene groups is 19 per molecule; and an oxyperfluoromethylene unit and an oxyperfluoroethylene unit are randomly bonded to each other.)

The solvent was then distilled off under a reduced pressure to obtain a monomer having a poly(perfluoroalkylene ether) chain and represented by structural formula (A-2-1) below (hereafter abbreviated as "monomer (A-2-1)").

[Chem. 10]

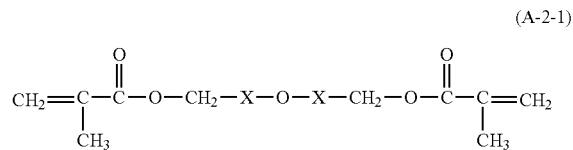

(A-2-1)

(In the formula, X represents a perfluoromethylene group and a perfluoroethylene group; the average number of perfluoromethylene groups is 17 per molecule and the average number of perfluoroethylene groups is 19 per molecule; and an oxyperfluoromethylene unit and an oxyperfluoroethylene unit are randomly bonded to each other.)

Synthetic Example 2

As Above

A glass flask equipped with a stirrer, a thermometer, a condenser tube, and a dropping device was charged with 20 parts by mass of a compound having a poly(perfluoroalkylene ether) chain and hydroxyl groups at both ends of the chain, the compound being represented by formula (a2-1-2) below, 20 parts by mass of diisopropyl ether serving as a solvent, 0.02 parts by mass of p-methoxyphenol serving as a polymerization inhibitor, and 3.1 parts by mass of triethylamine serving as a neutralizer. Stirring was initiated under air flow and, while the internal temperature of the flask was maintained at 10° C., 2.7 parts by mass of methacrylic acid chloride was dropped over one hour. After the dropping was completed, the mixed solution was stirred at 10° C. for one hour, heated to 30° C. and stirred for one hour, and then heated to 50° C. and stirred for 10 hours. The reaction was terminated after the disappearance of the methacrylic acid chloride was confirmed by the measurement of gas chromatography. The reaction product was then mixed with 40 parts by mass of diisopropyl ether serving as a solvent. Subsequently, a washing process was repeatedly performed three times in which the resulting solution was mixed with 80 parts by mass of ion-exchanged water, stirred, and left to stand to separate an aqueous layer, and the aqueous layer was removed. To the resulting solution, 0.02 parts by mass of p-methoxyphenol serving as a polymerization inhibitor was then added, and 8 parts by mass of magnesium sulfate serving as a dehydrating agent was added. The solution was left to stand for one day to be completely dehydrated. The dehydrating agent was then removed by filtration.

[Chem. 11]

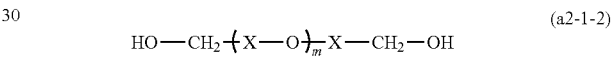

(a2-1-2)

(In the formula, X represents a perfluoromethylene group and a perfluoroethylene group; the average number of perfluoromethylene groups is 7 per molecule and the average number of perfluoroethylene groups is 8 per molecule; and an oxyperfluoromethylene unit and an oxyperfluoroethylene unit are randomly bonded to each other.)

The solvent was then distilled off under a reduced pressure to obtain a monomer having a poly(perfluoroalkylene ether) chain and represented by structural formula (A-2-2) below (hereafter abbreviated as "monomer (A-2-2)").

[Chem. 12]

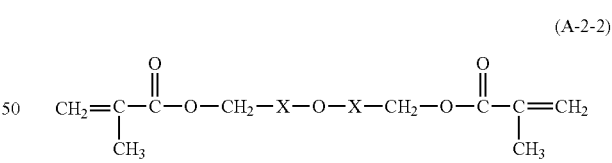

(A-2-2)

(In the formula, X represents a perfluoromethylene group and a perfluoroethylene group; the average number of perfluoromethylene groups is 7 per molecule and the average number of perfluoroethylene groups is 8 per molecule; and an oxyperfluoromethylene unit and an oxyperfluoroethylene unit are randomly bonded to each other.)

Example 1

Preparation of Fluorine-Containing Curable Resin of the Present Invention

A glass flask equipped with a stirrer, a thermometer, a condenser tube, and dropping devices was charged with 425 parts by mass methyl isobutyl ketone and 1,305 parts by mass of 1,3-bis(trifluoromethyl)benzene serving as solvents. These solvents were heated to 95° C. while being stirred under nitrogen flow. Three solutions for dropping were then individually charged into the dropping devices: a solution (liquid 1) prepared by dissolving 209 parts by mass of the monomer (A-2-1) obtained in Synthetic Example 1 in 145 parts by mass 1,3-bis(trifluoromethyl)benzene; a solution (liquid 2) prepared by dissolving 836 parts by mass of 3,4,5,6-tetrahydrophthalimide ethyl acrylate in a mixed solvent of 643 parts by mass of methyl isobutyl ketone and 200 parts by mass of 1,3-bis(trifluoromethyl)benzene; and a solution (liquid 3) prepared by dissolving 11 parts by mass of t-butylperoxy-2-ethylhexanoate serving as a radical polymerization initiator and 53 parts by mass of pentaerythritol tetrakis(3-mercaptobutyrate) represented by formula (B-1) below in 420 parts by mass of methyl isobutyl ketone. The dropping of these solutions was simultaneously initiated. The liquid 1 and liquid 2 were dropped over 2 hours and the liquid 3 was dropped over 2 hours and 20 minutes while the internal temperature of the flask was maintained at 95° C. After the dropping was completed, stirring was performed at 95° C. for 5 hours.

[Chem. 13]

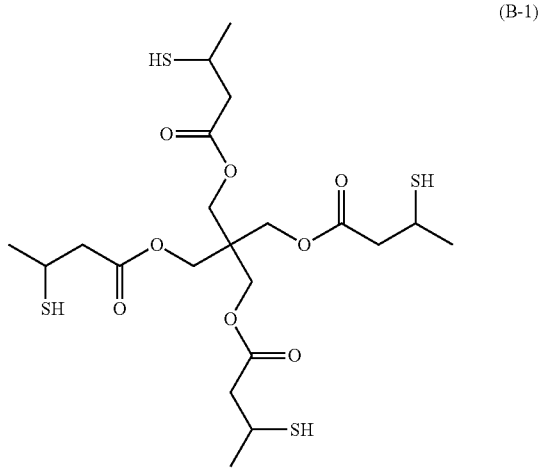

(B-1)

Figure 2:
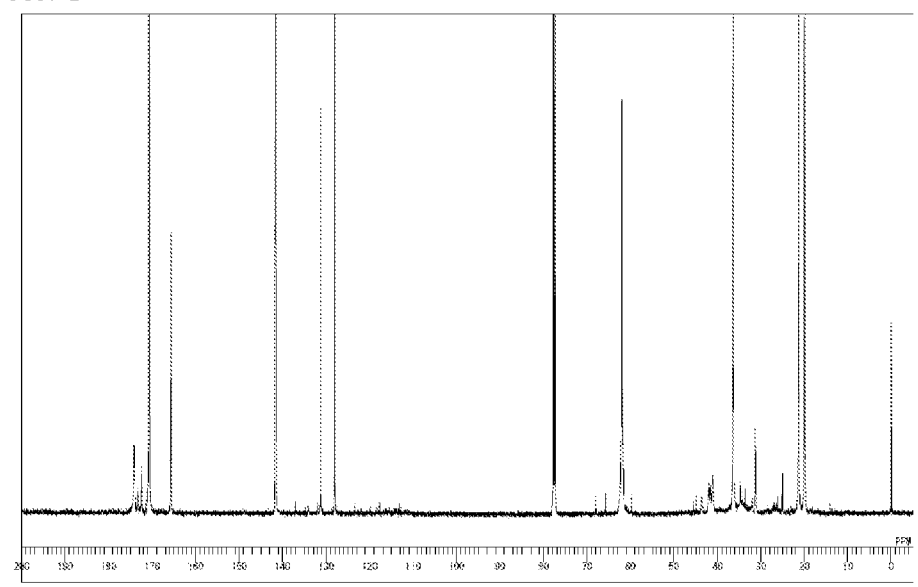
FIG. 2 is a $^{13}$C-NMR chart of the fluorine-containing curable resin (1) obtained in Example 1.
Figure 3:
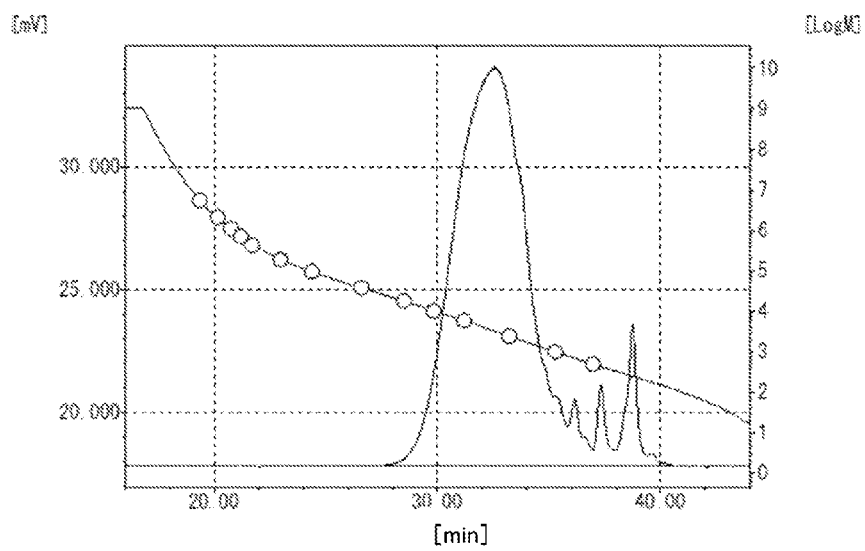
FIG. 3 is a GPC chart of the fluorine-containing curable resin (1) obtained in Example 1.

After the reaction solution was cooled to room temperature, the matter insoluble in the solution was filtered to obtain a solution containing 14.9% by mass of a fluorine-containing curable resin (1) of the present invention. The molecular weight of the fluorine-containing curable resin (1) was measured by GPC (molecular weight in terms of polystyrene). The number-average molecular weight was 2,000 and the weight-average molecular weight was 4,000. FIG. 1 shows the IR spectrum chart of the fluorine-containing curable resin (1). FIG. 2 shows the $^{13}$C-NMR chart of the fluorine-containing curable resin (1). FIG. 3 shows the GPC chart of the fluorine-containing curable resin (1).

Comparative Example 1

Preparation of Fluorine-Containing Curable Resin Having a poly(Perfluoroalkylene Ether) Chain A glass flask equipped with a stirrer, a thermometer, a condenser tube, and dropping devices was charged with 146.1 parts by mass of 1,3-bis(trifluoromethyl)benzene serving as a solvent. These solvents were heated to 105° C. while being stirred under nitrogen flow. Three solutions for dropping were then individually charged into the dropping devices: 83.5 parts by mass of the monomer (A-2-1) obtained in Synthetic Example 1 (liquid 1); 160 parts by mass of 2-hydroxyethyl methacrylate (hereafter abbreviated as "HEMA") (liquid 2); and a solution (liquid 3) prepared by dissolving 36.5 parts by mass of t-butylperoxy-2-ethylhexanoate serving as a radical polymerization initiator in 306.2 parts by mass of 1,3-bis(trifluoromethyl)benzene. These solutions were simultaneously dropped over 2 hours while the internal temperature of the flask was maintained at 105° C. After the dropping was completed, stirring was performed at 105° C. for 5 hours to obtain a copolymer of the monomer (A-2-1) and HEMA.

Subsequently, 0.17 parts by mass of p-methoxyphenol serving as a polymerization inhibitor and 0.13 parts by mass of tin octylate serving as a urethane-forming catalyst were added. Stirring was initiated under air flow. While the temperature was maintained at 60° C., 169.9 parts by mass of 2-acryloyloxyethyl isocyanate was dropped over one hour. After the dropping was completed, the solution was stirred at 60° C. for 2 hours and then heated to 80° C. and stirred for 4 hours. The disappearance of an absorption peak around 2360 cm$^{-1}$ derived from an isocyanate group was confirmed by the measurement of IR spectrum. Subsequently, 1,3-bis(trifluoromethyl)benzene was added to obtain a solution containing 50% by mass of a fluorine-containing curable resin (1') for comparison. The molecular weight of the fluorine-containing curable resin (1') for comparison was measured by GPC (molecular weight in terms of polystyrene). The number-average molecular weight was 1,200 and the weight-average molecular weight was 6,300.

Comparative Example 2

As Above

Another glass flask equipped with a stirrer, a thermometer, a condenser tube, and dropping devices was charged with 63 parts by mass of methyl isobutyl ketone serving as a solvent. The solvent was heated to 105° C. while being stirred under nitrogen flow. Three solutions for dropping were then individually charged into the dropping devices: 21.5 parts by mass of the monomer (A-2-2) obtained in Synthetic Example 2 (liquid 1); 41.3 parts by mass of HEMA (liquid 2); and 135.4 parts by mass of a solution (liquid 3) prepared by dissolving 9.4 parts by mass of t-butylperoxy-2-ethylhexanoate serving as a radical polymerization initiator in 126 parts by mass of methyl isobutyl ketone. These solutions were simultaneously dropped over 2 hours while the internal temperature of the flask was maintained at 105° C. After the dropping was completed, stirring was performed at 105° C. for 10 hours. The solvent was then distilled off under a reduced pressure to obtain a copolymer of the monomer (A-2-2) and HEMA.

Subsequently, 74.7 parts by mass of methyl ethyl ketone serving as a solvent, 0.1 parts by mass of p-methoxyphenol serving as a polymerization inhibitor, and 0.06 parts by mass of dibutyl tin dilaurate serving as a urethane-forming catalyst were added. Stirring was initiated under air flow. While the temperature was maintained at 60° C., 44.8 parts by mass of 2-acryloyloxyethyl isocyanate was dropped over one hour. After the dropping was completed, the resulting solution was stirred at 60° C. for 1 hour and then heated to 80° C. and stirred for 10 hours to cause a reaction. The disappearance of an isocyanate group was confirmed by the measurement of IR spectrum. Subsequently, 37.4 parts by mass of methyl ethyl ketone serving as a solvent was added to obtain a solution containing 50% by mass of a fluorine-containing curable resin (2') for comparison. The molecular weight of the fluorine-containing curable resin (2') for comparison was measured by GPC (molecular weight in terms of polystyrene). The number-average molecular weight was 2,400 and the weight-average molecular weight was 7,100.

Comparative Example 3

Preparation of a Fluorine-Containing Curable Resin Having a poly(Perfluoroalkylene Ether) Chain and a Maleimide Group A glass flask equipped with a stirrer, a thermometer, a condenser tube, and dropping devices was charged with 3,275 parts by mass of methyl isobutyl ketone serving as a solvent. The solvent was heated to 105° C. while being stirred under nitrogen flow. Three solutions for dropping were then individually charged into the dropping devices: 191 parts by mass of the monomer (A-2-2) obtained in Synthetic Example 2 (liquid 1); a solution (liquid 2) prepared by dissolving 762 parts by mass of 3,4,5,6-tetrahydrophthalimide ethyl acrylate in 1,288 parts by mass of methyl isobutyl ketone; and a solution (liquid 3) prepared by dissolving 143 parts by mass of t-butylperoxy-2-ethylhexanoate serving as a radical polymerization initiator in 835 parts by mass of methyl isobutyl ketone. These solutions were simultaneously dropped over 2 hours while the internal temperature of the flask was maintained at 105° C. After the dropping was completed, stirring was performed at 105° C. for 10 hours.

After the reaction solution was cooled to room temperature, the matter insoluble in the solution was filtered to obtain a solution containing 16% by mass of a fluorine-containing curable resin (3') for comparison. The molecular weight of the fluorine-containing curable resin (3') for comparison was measured by GPC (molecular weight in terms of polystyrene). The number-average molecular weight was 2,000 and the weight-average molecular weight was 6,000.

Preparation of a Base Resin Composition of an Active-Energy-Ray-Curable Composition A base resin composition of an active-energy-ray-curable composition was obtained by mixing and dissolving 50 parts by mass of pentafunctional non-yellowing urethane acrylate, 50 parts by mass of dipentaerythritol hexaacrylate, 25 parts by mass of butyl acetate, 5 parts by mass of 1-hydroxycyclohexyl phenyl ketone ("Irgacure 184" manufactured by BASF Japan Ltd.) serving as a photopolymerization initiator, and 54 parts by mass of toluene, 28 parts by mass of 2-propanol, 28 parts by mass of ethyl acetate, and 28 parts by mass of propylene glycol monomethyl ether serving as solvents.

Examples 3 and 4 and Comparative Examples 5 to 9

To 268 parts by mass of the base resin composition obtained above, solutions of the fluorine-containing curable resins obtained in Example 1 and Example 2 and solutions of the fluorine-containing curable resins for comparison obtained in Comparative Examples 1 to 4 were added as a resin content in an amount of 1 part by mass. Each of the mixtures was uniformly mixed to provide active-energy-ray-curable compositions 1 and 2 and active-energy-ray-curable comparisons 1' to 4' for comparison. Each of the active-energy-ray-curable compositions was then applied to a polyethylene terephthalate (PET) film having a thickness of 188 μm with a bar coater No. 13. The film was then inserted into a dryer at 60° C. for 5 minutes to evaporate the solvent. The dried film was then cured by irradiation with ultraviolet rays (UV) using an ultraviolet curing apparatus to obtain a film (coating film) on which a cured coating film was stacked. Herein, the irradiation with ultraviolet rays was performed in an air atmosphere (oxygen concentration: 21 vol %) at an ultraviolet radiation dose of 3.5 kJ/m$^2$ using a high-pressure mercury lamp.

The stain resistant properties of the coating surfaces of the coating films obtained above were evaluated in terms of stain anti-adhesion property, ease of wiping off stains, and stain anti-adhesion property after wiping off of stains. The evaluation methods are described below.

[Evaluation of Stain Anti-Adhesion Property]

A line was drawn on each of the coating surfaces of the coating films with a felt-tip pen ("Magic Ink, large, black" manufactured by Teranishi Chemical Industry Co., Ltd.). The state of adhesion of the black ink was visually inspected to conduct the evaluation of stain anti-adhesion property. The evaluation criteria are as follows.

A: The stain resistant properties are the best and the ink is repelled in the form of droplets.

B: The ink is repelled not in the form of droplets but in the form of lines (the line width is less than 50% of the tip width of the felt-tip pen).

C: The ink is repelled in the form of lines and the line width is 50% or more and less than 100% of the tip width of the felt-tip pen.

D: The ink is not repelled at all and a clear line is drawn on the surface.

[Evaluation of Ease of Wiping Off Stains]

After the test regarding the stain anti-adhesion property was performed, the number of times wiping was performed until the adhered ink was completely wiped off with a piece of tissue paper at a load of 500 g was measured to evaluate the ease of wiping off stains on the basis of the following criteria.

A: The ink was completely removed with a single wiping-off action.

B: The ink was completely removed with two to ten wiping-off actions.

C: The ink was not completely removed with ten wiping-off actions.

[Evaluation of Stain Anti-Adhesion Property after Wiping Off of Stains]

After the test regarding the ease of wiping off stains was performed, a line was drawn again with a felt-tip pen ("Magic Ink, large, black" manufactured by Teranishi Chemical Industry Co., Ltd.). The state of adhesion of the black ink was visually inspected to conduct the evaluation of stain anti-adhesion property. The evaluation criteria are as follows.

A: The stain resistant properties are the best and the ink is repelled in the form of droplets.

B: The ink is repelled not in the form of droplets but in the form of lines (the line width is less than 50% of the tip width of the felt-tip pen).

C: The ink is repelled in the form of lines and the line width is 50% or more and less than 100% of the tip width of the felt-tip pen.

D: The ink is not repelled at all and a clear line is drawn on the surface.

Table 1 shows the above evaluation results.

TABLE 1

| | Active-energy-ray-curable composition | Fluorine-containing curable resin | Stain anti-adhesion property | Ease of wiping off stains | Stain anti-adhesion property after wiping off of stains |
|---|---|---|---|---|---|
| Example 3 | 1 | (1) | A | A | B |
| Comparative Example 5 | 1' | (1') | C | A | D |
| Comparative Example 6 | 2' | (2') | C | B | D |
| Comparative Example 7 | 3' | (3') | B | B | C |
| Comparative Example 8 | 5' | none | D | C | D |

It was found from the evaluation results shown in Table 1 that the cured coating film of the active-energy-ray-curable composition in Example 3 that contained the fluorine-containing curable resin (1) obtained in Example 1 and serving as the fluorine-containing curable resin according to the present invention was excellent in terms of stain anti-adhesion property, ease of wiping off stains, and stain anti-adhesion property after wiping off of stains, the cured coating film having high stain resistant properties despite the fact that the curing was performed by irradiation with ultraviolet rays in an air atmosphere. This is because a mercapto group present in the fluorine-containing curable resin according to the present invention reacts with an acryloyl group of urethane acrylate or the like serving as a matrix component in the active-energy-ray-curable composition, and therefore the fluorine-containing curable resin according to the present invention is firmly fixed to the surface of the coating film.

The feature of the reaction between the mercapto group and the acryloyl group is that the reaction is less subject to polymerization inhibition due to oxygen even when curing is performed by irradiation with ultraviolet rays in an air atmosphere. The polymerization inhibition due to oxygen is caused by a reaction between a terminal radical of a growing polymer and oxygen in the air. A peroxide radical generated herein does not react with an acryloyl group, and thus the polymerization is terminated. However, when a mercapto group is present in the polymerization system, the generated peroxide radical abstracts hydrogen of the mercapto group to generate a thiyl radical. This thiyl radical can initiate polymerization through a reaction with the acryloyl group and the polymerization favorably proceeds. As a result, the fluorine-containing curable resin according to the present invention is firmly fixed to the cured coating film without being subjected to polymerization inhibition due to oxygen. Furthermore, a maleimide group included in the fluorine-containing curable resin according to the present invention causes photodimerization through irradiation with ultraviolet rays and cross-links polymer chains of the fluorine-containing curable resin according to the present invention. This provides a cured coating film having higher stain resistant properties.

On the other hand, it was found that the cured coating film of the active-energy-ray-curable composition in Comparative Example 5 that contained the fluorine-containing curable resin (1') for comparison obtained in Comparative Example 1 was good in terms of ease of wiping off stains, but was poor in terms of stain anti-adhesion property and stain anti-adhesion property after wiping off of stains, the cured coating film having rather low anti-adhesion properties. This is because the polymerizable unsaturated group of the fluorine-containing curable resin (1') was an acryloyl group and the polymerization was inhibited by oxygen, and therefore the polymerization did not sufficiently proceed and a strong cured coating film was not formed.

It was found that the cured coating films of the active-energy-ray-curable compositions in Comparative Examples 6 and 7 that respectively contained the fluorine-containing curable resins (2') and (3') for comparison obtained in Comparative Examples 2 and 3 were poor in terms of stain anti-adhesion property, ease of wiping off stains, and stain anti-adhesion property after wiping off of stains, the cured coating films having low anti-adhesion properties. The reason for this is as follows. Regarding the fluorine-containing curable resin (2') for comparison, the polymerizable unsaturated group was an acryloyl group as in the case of the fluorine-containing curable resin (1') for comparison and the polymerization was inhibited by oxygen, and therefore the polymerization did not sufficiently proceed and a strong cured coating film was not formed. Regarding the fluorine-containing curable resin (3') for comparison, only a maleimide group was involved in polymerization and photodimerization between maleimide groups proceeded, but polymerization with urethane acrylate or the like serving as a matrix component did not sufficiently proceed and therefore the fluorine-containing curable resin (3') for comparison was not fixed in the cured coating film. It was also found that the adhesion of stains was not able to be prevented at all in Comparative Example 8 in which a fluorine-containing curable resin was not added.

The invention claimed is:

1. A fluorine-containing curable resin comprising a poly(perfluoroalkylene ether) chain, a maleimide group, and a mercapto group in a structure of a polymer which is either a urethane polymer or a polymer comprises of a monomer having a polymerizable unsaturated group.

2. The fluorine-containing curable resin according to claim 1, wherein the polymer is the polymer comprises of a monomer having a polymerizable unsaturated group.

3. The fluorine-containing curable resin according to claim 1, wherein the fluorine-containing curable resin is obtained by copolymerizing, in the presence of a polyfunctional thiol (C), a monomer (A) having a poly(perfluoroalkylene ether) chain and polymerizable unsaturated groups at both ends of the chain and a monomer (B) having a maleimide group and a polymerizable unsaturated group other than the maleimide group, the monomer (A) and monomer (B) serving as essential monomer components.

4. The fluorine-containing curable resin according to claim 3, wherein the maleimide group included in the monomer (B) is a maleimide group represented by general formula (1) below,

[Chem. 1]

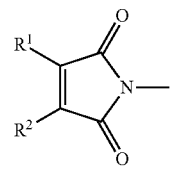

(1)

(in the formula, $R^1$ and $R^2$ each independently represent an alkyl group having 1 to 6 carbon atoms or $R^1$ and $R^2$ together form a five- or six-membered cyclic hydrocarbon group).

5. The fluorine-containing curable resin according to claim 3, wherein the polymerizable unsaturated group included in the monomer (A) is a (meth)acryloyl group.

6. The fluorine-containing curable resin according to claim 3, wherein the polyfunctional thiol (C) is at least one compound selected from the group consisting of pentaerythritol tetrakis(3-mercaptobutyrate), pentaerythritol tetrakisthiopropionate, tris(3-mercaptobutyloxyethyl)isocyanurate, and dipentaerythritol hexakisthiopropionate.

7. The fluorine-containing curable resin according to claim 3, wherein the content of the polyfunctional thiol (C) is in the range of 0.1 to 50 parts by mass relative to 100 parts by mass in total of the monomers having a polymerizable unsaturated group.

8. A cured product obtained by applying the fluorine-containing curable resin according to claim 1 onto a base material and curing the applied fluorine-containing curable resin through irradiation with active energy rays.

9. An active-energy-ray-curable composition comprising the fluorine-containing curable resin according to claim 1 and an active-energy-ray-curable resin (D) or an active-energy-ray-curable monomer (E).

10. A cured product obtained by applying the active-energy-ray-curable composition according to claim 9 onto a base material and curing the applied active-energy-ray-curable composition through irradiation with active energy rays.

* * * * *